United States Patent
Sattiraju

(10) Patent No.: US 10,204,200 B2
(45) Date of Patent: Feb. 12, 2019

(54) VARIATION-AWARE DESIGN ANALYSIS

(71) Applicant: Oracle International Corporation, Redwood Shores, CA (US)

(72) Inventor: Sri Harsha Sattiraju, Fremont, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 45 days.

(21) Appl. No.: 15/197,366

(22) Filed: Jun. 29, 2016

(65) Prior Publication Data

US 2018/0004880 A1  Jan. 4, 2018

(51) Int. Cl.
*G06F 17/50* (2006.01)

(52) U.S. Cl.
CPC ...... *G06F 17/5045* (2013.01); *G06F 17/5036* (2013.01); *G06F 1/3203* (2013.01); *G06F 1/3237* (2013.01); *G06F 17/504* (2013.01); *G06F 17/505* (2013.01); *G06F 17/5081* (2013.01); *G06F 2217/14* (2013.01)

(58) Field of Classification Search
CPC .. G06F 17/505; G06F 17/504; G06F 17/5036; G06F 17/5045; G06F 17/5081; G06F 1/3203; G06F 1/3237
See application file for complete search history.

(56) References Cited

U.S. PATENT DOCUMENTS

| | | | |
|---|---|---|---|
| 6,901,570 B2 | 5/2005 | Lu | |
| 7,082,387 B1* | 7/2006 | Wolfe, Jr. | G06F 17/50 700/98 |
| 7,620,921 B2* | 11/2009 | Foreman | G06F 17/5031 716/113 |
| 7,716,023 B2 | 5/2010 | Barker et al. | |
| 8,255,851 B1* | 8/2012 | Baransy | G06F 17/5031 716/113 |
| 8,271,256 B2 | 9/2012 | Khalily et al. | |
| 8,307,309 B1* | 11/2012 | del Mar Hershenson | G06F 17/5045 716/111 |
| 8,307,324 B2 | 11/2012 | Jamann et al. | |
| 8,336,010 B1* | 12/2012 | Chang | G06F 17/504 716/108 |

(Continued)

OTHER PUBLICATIONS

Lin et al.; "Performance-Aware Corner Model for Design for Manufacturing"; Year: 2009; IEEE Transactions on Electron Devices; vol. 56, Issue: 4; pp. 595-600; cited by: Papers (10).*

(Continued)

*Primary Examiner* — Helen Rossoshek
(74) *Attorney, Agent, or Firm* — Fish IP Law, LLP

(57) ABSTRACT

A microprocessor evaluation system evaluates a microprocessor circuit by using analysis-specific custom corners that are derived specifically for the analysis of interest. Circuit parameters specific to the analysis of interest are applied to a proposed design to derive the custom corners, which will trigger violations more accurately than corners selected using traditional methods. The custom corners could also be reused in between design phases to reduce redesign simulation time. Local process parameters could be taken into account using worst-case local parameter offsets to detect violations in a far more accurate manner than using generic guard-band budgets.

18 Claims, 8 Drawing Sheets

(56) References Cited

U.S. PATENT DOCUMENTS

| | | | |
|---|---|---|---|
| 8,494,670 B2 | 7/2013 | McConaghy et al. | |
| 8,539,427 B2 | 9/2013 | Lu | |
| 8,560,294 B1* | 10/2013 | Ren | G06F 17/5036 703/14 |
| 8,572,539 B2* | 10/2013 | Cortadella | H03K 19/20 327/142 |
| 8,612,908 B2 | 12/2013 | Cooper et al. | |
| 8,818,784 B1* | 8/2014 | Rubero | G06F 17/5022 703/14 |
| 8,819,605 B1 | 8/2014 | Barker | |
| 8,903,697 B2 | 12/2014 | Trombley et al. | |
| 9,009,638 B1* | 4/2015 | Hook | G06F 17/5036 716/106 |
| 9,141,742 B2* | 9/2015 | Tsai | G06F 17/505 |
| 2008/0307240 A1* | 12/2008 | Dahan | G06F 1/06 713/320 |
| 2009/0298415 A1* | 12/2009 | Gudem | H03F 1/0244 455/1 |
| 2009/0327989 A1* | 12/2009 | Zhuoxiang | G06F 17/5081 716/126 |
| 2010/0131249 A1* | 5/2010 | Homma | G06F 17/5036 703/2 |
| 2010/0332208 A1* | 12/2010 | Victory | G06F 17/5036 703/14 |
| 2012/0035892 A1 | 2/2012 | Lu | |
| 2012/0316858 A1* | 12/2012 | Kundert | G01R 31/31835 703/14 |
| 2013/0226544 A1* | 8/2013 | Mcconaghy | G06F 17/5022 703/2 |
| 2015/0242560 A1* | 8/2015 | Arsovski | G06F 17/5081 716/113 |
| 2016/0321391 A1* | 11/2016 | Lu | G06F 17/5036 |
| 2016/0364517 A1* | 12/2016 | Pelloie | G06F 17/5031 |

OTHER PUBLICATIONS

Sengupta et al.; "Application-specific worst case corners using response surfaces and statistical models"; Year: 2005,; IEEE Transactions on Computer-Aided Design of Integrated Circuits and Systems; vol. 24, Issue: 9; pp. 1372-1380.*

Wang et al.; "Compact modeling for application-specific high-sigma worst case"; Year: 2013; 2013 International Conference on Simulation of Semiconductor Processes and Devices (SISPAD); pp. 61-64.*

Yu, Ben, "Statistical Verification and Optimization of Integrated Circuits," Electrical Engineering and Computer Sciences, University of California, Berkeley, Technical Report No. UCB/EECS-2011-31, Apr. 22, 2011, 106 pages.

Dyck, Jeff, et al., "De-risking Variation-Aware Custom IC Design with Solido Variation Designer and Synopsys HSPICE," White Paper, Sep. 2010, 14 pages.

McConaghy, T., et al., "Variation-Aware Design of Custom Integrated Circuits: A Hands-On Field Guide," Chapter 2, Fast PVT Verification and Design, Efficiently Managing Process-Voltage-Temperature Corners, Springer Science+Business Media, New York, 2013, pp. 13-39.

"Variation-AwareCustom IC Design: Improving PVT and Statistical Maximum Yield at the Performance Edge," Solido Design Automation, Inc., San Jose, CA, http://www.solidodesign.com/, 6 pages.

* cited by examiner

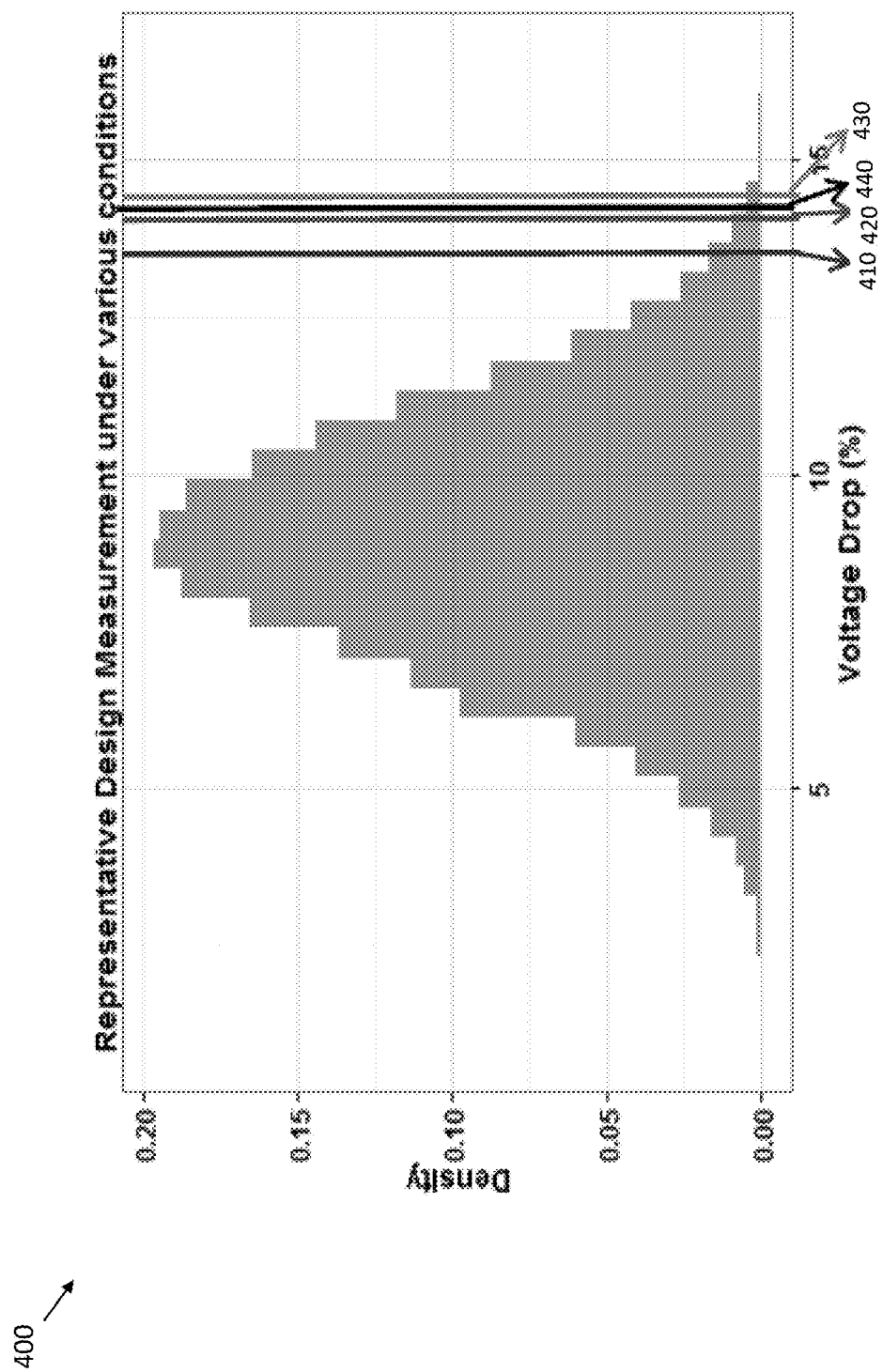

VARIATION-AWARE DESIGN ANALYSIS

FIELD OF THE INVENTION

The field of the invention is circuit design analysis.

BACKGROUND

The background description includes information that may be useful in understanding the present invention. It is not an admission that any of the information provided herein is prior art or relevant to the presently claimed invention, or that any publication specifically or implicitly referenced is prior art.

The physical product of any design will vary from an idealized design due to imperfect manufacturing conditions. The competitive world of microchip design requires that design engineers test new designs having inherent construction variations quickly and accurately. Design engineers can test microchip designs using a design-of-experiments (DOE) technique by simulating a new design with process corners that represent the extreme attributes when parameters vary. Fully exhaustive simulations using all process corners are highly accurate but may take days to run, whereas simulations using only a few process corners take only minutes to run, but may not detect the best and worst-case scenarios.

Simplistic FEOL (Front End of Line) traditional corners can be chosen by simulating a circuit where the NMOS and PMOS transistors have no variation (referred to as typical), when they are at their fastest, and when they are at their slowest, which would provide five corners to test (i.e. typical, fast-fast, fast-slow, slow-fast, and slow-slow). However, traditional FEOL corners are overly simplistic, and frequently represent impossible worst-case scenarios.

A design engineer might perform simulations that sweep through a range of values at predetermined intervals across corners, but randomized techniques require many repeated iterations to provide accuracy which wastes time. Relationships between performance targets and statistical model parameters could be used to strategically choose corner models, however it is difficult to derive statistical model parameters that would provide accurate worse-case scenarios.

Thus, there remains a need for a system and method that derives and tests process corners specifically for different design analysis.

SUMMARY OF THE INVENTION

The following description includes information that may be useful in understanding the present invention. It is not an admission that any of the information provided herein is prior art or relevant to the presently claimed invention, or that any publication specifically or implicitly referenced is prior art.

The subject matter provides apparatus, systems, and methods which analyze designs for a microprocessor circuit using analysis-specific custom corners. As used herein, an "analysis-specific custom corner" is one whose circuit parameters are chosen specifically for the analysis-of-interest. As used herein, an "analysis of interest" comprises an analysis that is targeted to evaluate at least one measurement of interest for a variable of the microprocessor, circuit, or component design under simulated conditions for a type of analysis. For example, an analysis might evaluate set up time, hold time, voltage leakage, writability, charge-sharing, leakage power, dynamic power, and/or noise margins. A voltage leakage analysis could evaluate a measurement of a voltage drop at a node of a dynamic circuit in a microprocessor circuit, and a set up time analysis could evaluate a measurement of a time to set up a flip-flop in a microprocessor circuit.

The disclosed system receives a proposed design for the microprocessor circuit from a user for evaluation, for example as a SPICE (Simulation Program with Integrated Circuit Emphasis) design file submitted through a user interface that transfers the file to the corner simulation system. Any suitable data that embodies the schematic and/or a layout for a microprocessor design could be used, such that an electronic circuit simulator simulates the microprocessor design under various design circumstances. The simulation system could generate a model to simulate the proposed design using any circuit simulation program, such as, by way of a nonlimiting example, HSPICE, PSPICE, XSPICE, and/or Cider.

At least one analysis of interest from a set of analyses of interest is selected for evaluating the proposed design. Typically, such analyses comprise a set of allowed limits and/or violation thresholds for one or more microprocessor measurements. For example, a voltage leakage analysis of interest could be defined as a set of allowed values for a voltage that has at least 93% of the supply voltage and a set of violation values when a voltage falls below 93% of the supply voltage. In such a scenario, the value of 93% would be considered a "violation threshold" value or an "allowed limit" that delineates the difference between an allowed value and a violation value. In another example, a hold time analysis of interest could be defined as a test that triggers a violation when a hold time falls below 15 picoseconds.

The system provides a user interface through which a user selects one or more analyses of interest from a list of available analyses. For example a user could select a timing analysis to test how quickly an output changes based upon an input change, a power analysis to test how quickly power dissipates in the circuit, and a voltage leakage analysis to test the lowest detected voltage at a node in a circuit as compared to the source voltage. A user of the system could also define allowed values and/or violation values for measurements being tested and could define preferred triggers to occur when the system detects a violation, or could select from a list of predefined allowed values, violation values, and/or triggers (i.e. actions executed by the system upon the detection of a predefined event). In other embodiments, the system automatically selects one or more analyses of interest and settings for the allowed limits in accordance with preconfigured templates, for example as a function of the type of microprocessor or as a function of company standards.

Once an analysis of interest has been selected, the system selects a set of circuit parameters from a database containing representative circuit parameters as a function of the analysis of interest. The selected set of representative circuit parameters have analysis-specific stimuli befitting the proposed circuit design. Representative circuit parameters are stored in any suitable manner for storing data, for example in any suitable data storage structure, such as a database, an XML file, and/or as an encrypted file, but is preferably stored in a SPICE data file such as a SPICE deck in the form of a set of netlists, input stimuli and/or measurements that define components that are applied to the proposed design schematic, such as latches, flops, and memory designs. Such components may include MOSFET logic gates, FinFET logic gates, and/or interconnects (e.g. wire nodes, resistors, capacitors). The database preferably associates each set of circuit parameters with at least one analysis, since the circuit parameters are designed with analysis specific stimuli which are used to test for violations of one or more analyses of interest. In some embodiments, the system may split the saved circuit parameters in different logical sections of a database—one logical section for each analysis of interest. So, for example, one logical section of the database contains set up time SPICE netlists, another logical section contains hold time SPICE netlists, and another logical section contains noise margin SPICE netlists. An exemplary database is configured to have a plurality of topologies for each component. For example, a database for testing voltage leakage might be configured to have two or more different flip-flop topologies to select from, where each has a corresponding netlist.

The system applies the selected circuit parameters to the proposed design to construct one or more analysis-specific simulation models—one for each set of circuit parameters. For example, the system is programmed to apply an analysis-specific SPICE netlist with analysis-specific input stimuli that correspond to an analysis of interest to a schematic or layout to construct an analysis-specific simulation model that is used to derive a set of custom corners that are specific to the analysis of interest. This allows the system to improve, verify, and/or fix performance and functionality metrics for the analysis of interest. In some embodiments, a user designates a subset of the topologies to test, or directs the system to test all available topologies associated with the analysis of interest.

The system is configured to derive custom corners for an analysis of interest using the analysis-specific simulation model. In one embodiment, the system first simulates each analysis-specific simulation model to obtain a representative distribution of process corners. As used herein, "global process parameters" are parameters that vary between chips constructed based upon an analysis-specific simulation model, and how that average will drift between lots, wafers, and/or dies. As used herein, "local process parameters" are parameters that vary between devices on the same wafer or die. In some embodiments, the system simulates each analysis-specific simulation model while varying a set of global process parameters to generate the representative distribution of process corners, while in other embodiments the system first simulates each analysis-specific simulation model while varying both a set of global process parameters and a set of local process parameters to generate the representative distribution of process corners. Since the analysis-specific circuit parameters are designed to closely examine edge-case scenarios that trigger violation conditions, the representative distribution of process corners will more accurately represent worse-case empirical models that are more likely to trigger violation conditions. Preferably, the system is programmed to target distributive groupings that are the closest to the traditional FEOL corners within sigma tolerances, and/or target the highest distributive groupings of derived process corners.

The system preferably fits the derived process corners from the simulation results to a Weibull distribution, transforms the Weibull distribution to a Gaussian distribution, and/or adjusts the custom corners as a function of the set of simulated measurement data (e.g. to account for a joint probability Gaussian distribution or for covariance of multiple metrics using a joint probability distribution set). By performing statistical design analysis up-front, there is no run-time impact during design analysis, making such a system comparable to a deterministic analysis. Since the corners derived are analysis-specific, such chosen corners produce more accurate results by minimizing the chances of having missing or false violations.

When a set of custom corners are derived specific to the analysis of interest, the system simulates the proposed design using the derived custom corners as a set of representative worst-case empirical models (for example, based upon real SPICE simulations) to derive worst-case values for the tested microprocessor measurements of the analysis-of-interest. If the system detects a violation using such custom corners, the system triggers one or more corresponding violation actions. Such violation actions are typically defined by a user administering the tests to the proposed design. Contemplated violation actions include transmitting a notification of a violation when at least one of the worst-case empirical models violates at least one of the allowed limits of an analysis of interest or transmitting an instruction to redesign the proposed design to overcome the violation.

Under some circumstances, one of the simulated worst-case empirical models may trigger a violation. This is a normal and expected part of testing experimental new circuit designs. When a violation is triggered, the proposed design is rejected by the system as a faulty design until the violation has been overcome, for example by submitting a new design that does not trigger any violations using any of the analysis of interest or by waiving the violation. Any suitable way of redesigning a microprocessor circuit could be utilized, for example by redesigning functional blocks or redistributing clock signals or by utilizing automated methods. When a user submits a new redesign of the microprocessor circuit to the system, the system then applies the analysis-specific circuit parameters to the re-design to create a new analysis-specific simulation model, and the new analysis-specific simulation model is simulated using the derived custom corners without needing to derive new custom corners. Since the corners were previously derived, the simulation of new redesigns of the microprocessor circuit are very quick as compared to the prior art, which typically requires new corners to be derived with every new design.

In some embodiments, the system further increases the accuracy of the simulation results by performing statistical circuit simulations at the derived custom corners while varying local process parameters. The results of such simulations are analyzed to determine worst local process variation offsets within a standard deviation, for example a standard deviation of 2-$\sigma$, 3-$\sigma$, or even 4-$\sigma$. The system then adds the worst-case +/-$\sigma$ local variation offsets to the violation threshold in the analysis-of-interest or to the simulation results for the measurement of interest tested in the analysis-of-interest to account for local process parameter variation. By incorporating the worst-case local process variation offsets into the analysis, the analysis-specific corners need not have guard-band budgets—providing for a more realistic design analysis.

In some embodiments, the system also transmits a notification if the design fails to trigger a violation when the worst-case local process variation offset is not added. This allows a user of the system to understand that there is a possibility that use of the offset produces a false violation (is overly pessimistic). In such situations, or upon receiving a command to do so from the user, the system could be programmed to iteratively run simulations of the analysis-specific simulation model while fully varying global process parameters and/or local process parameters as a full golden analysis comprising all parameter variations varied across all thresholds. The system then transmits a notification to waive the violation when none of the golden set of empirical models violates any of the allowed limits of the analysis-of-interest. When some of the golden set of empirical models triggers the same violation, the system transmits a notification that the violation was not overly pessimistic and that the circuit needs to be redesigned.

Various objects, features, aspects and advantages of the inventive subject matter will become more apparent from the following detailed description of preferred embodiments, along with the accompanying drawing figures in which like numerals represent like components.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

BRIEF DESCRIPTION OF THE DRAWING

FIG. 4 shows a histogram illustrating alignment of different measurement results against custom corners.

DETAILED DESCRIPTION

Figure 1:
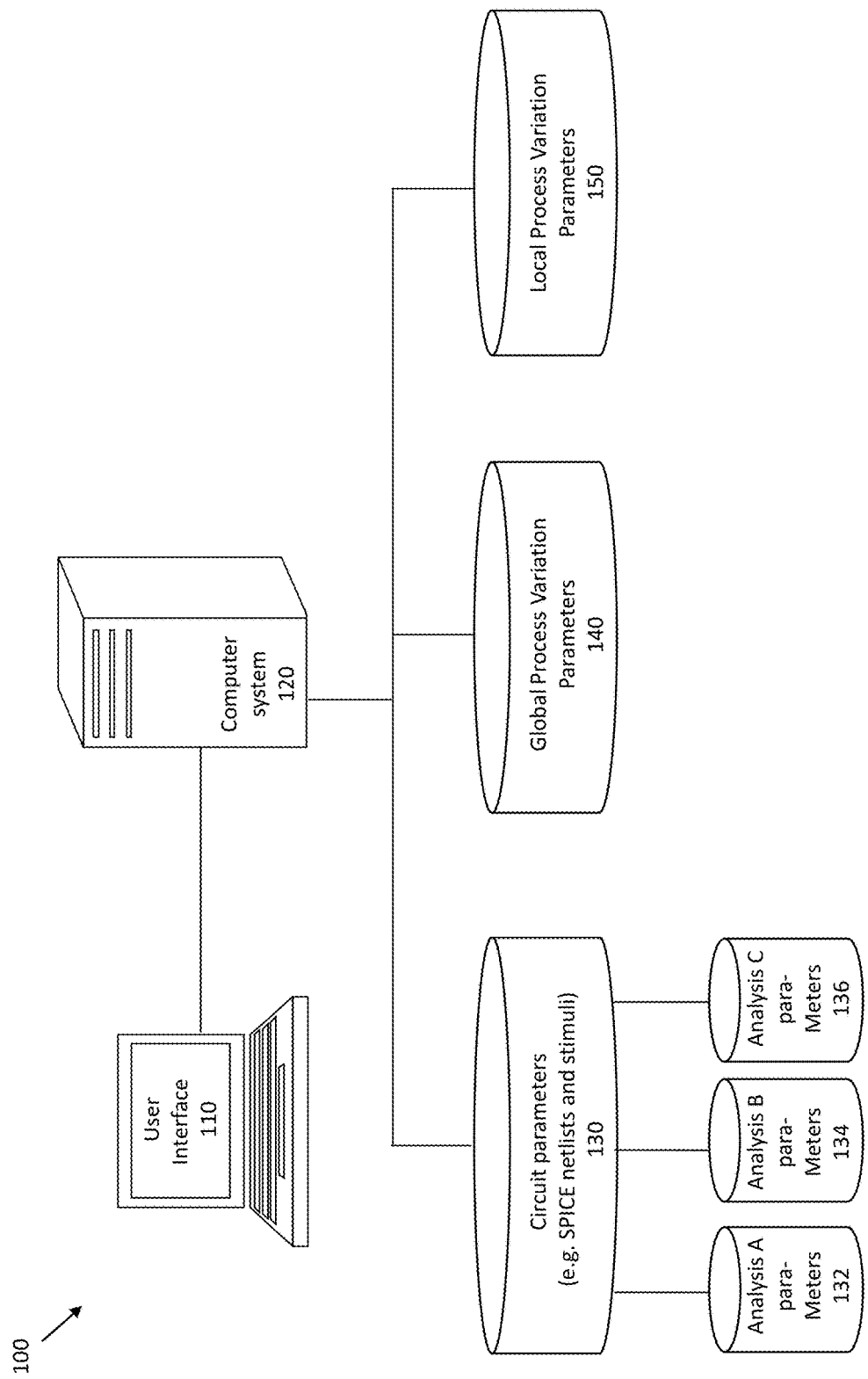
FIG. 1 shows a computer system programmed to perform analysis-specific simulations.

In some embodiments, the numbers expressing quantities used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

Unless the context dictates the contrary, all ranges set forth herein should be interpreted as being inclusive of their endpoints, and open-ended ranges should be interpreted to include commercially practical values. Similarly, all lists of values should be considered as inclusive of intermediate values unless the context indicates the contrary.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

It should be noted that any language directed to a computer system should be read to include any suitable combination of computing devices, including servers, interfaces, systems, databases, agents, peers, engines, controllers, or other types of computing devices operating individually or collectively. One should appreciate the computing devices comprise a processor configured to execute software instructions stored on a tangible, non-transitory computer readable storage medium (e.g., hard drive, solid state drive, RAM, flash, ROM, etc.). The software instructions preferably configure the computing device to provide the roles, responsibilities, or other functionality as discussed below with respect to the disclosed apparatus. In especially preferred embodiments, the various servers, systems, databases, or interfaces exchange data using standardized protocols or algorithms, possibly based on HTTP, HTTPS, AES, public-private key exchanges, web service APIs, known financial transaction protocols, or other electronic information exchanging methods. Data exchanges preferably are conducted over a packet-switched network, the Internet, LAN, WAN, VPN, or other type of packet switched network. Computer software that is "programmed" with instructions is developed, compiled, and saved to a computer-readable non-transitory medium specifically to accomplish the tasks and functions set forth by the disclosure when executed by a computer processor.

One should appreciate that the disclosed techniques provide many advantageous technical effects including constructing analysis-specific custom corners, reducing the runtime for design and redesigns by catering tests towards analysis-specific circuit parameters and analysis-specific custom corners, preventing overly optimistic and overly pessimistic results that are inherent in prior art guard-band processes, and performing statistical design analysis using multi-topology design techniques up front to reduce runtime impacts.

In FIG. 1, a computer schematic 100 that illustrates some embodiments of the subject matter is shown. The computer schematic 100 comprises a user interface 110 and a computer system 120 coupled to various data storage mediums, such as circuit parameters database 130, global process variation parameters database 140, and local process variation parameters database 150. User interface 110 is shown as a single computer terminal having an input keyboard and an output display screen, although the user interface 110 could be distributed among one or more other input and output interfaces without departing from the scope of the invention, such as a touch screen, mouse, keypad, trackball, speakers, microphone, motion tracker, storage drives or even a self-contained desktop computer system. The user interface 110 can also be implemented as multiple user interfaces that are coupled to computer system 120, where each distinct user interface serves as an input from the same or different users working on one or more projects. Computer system 120 is shown as a single computer having a processor and a non-transient computer-readable medium with software instructions that are programmed to perform the functions disclosed herein, but could likewise be distributed among a plurality of computers connected through network connections or even on the cloud. Data storage mediums 130, 140, and 150 are shown as separate NAS (Network Attached Storage) databases coupled to computer system 120 via network connections, but could be integrated into a single database or distributed among more than three non-transient computer-readable mediums. Moreover, while user interface 110, computer system 120, and data storage mediums 130, 140, and 150 are shown as physically separate hardware components, all could be integrated into a single computer system casing without departing from the scope of the invention. While the network connections between user interface 110, computer system 120, and data storage mediums 130, 140, and 150 are shown as physical networked connections between one another, contemplated networks could be wired or wireless, could be using one or many protocols to connect the devices, and/or could communicate through a LAN, intranet or the Internet, or other suitable networking means without departing from the scope of the invention.

User interface 110 provides a gateway through which a user accesses the system and input commands. Computer system 120 provides a computer processor that executes computer code saved on its non-transitory computer-readable medium, which in turn executes the functions described herein. Circuit parameters database 130 provides a data storage medium which holds analysis-specific circuit parameters that could be applied by the system to a proposed design of the user, for example, SPICE netlists that are designed specifically to detect leakage in a microprocessor circuit. Circuit parameters database 130 could be a single database, or could be segmented into several logically separate databases 132, 134, and 136—one for each analysis-of-interest. In some embodiments, a single set of circuit parameters could be used to perform several analysis-of-interest, which could then be duplicated among the databases or could be linked to using pointers. Global process variation parameter database 140 and local process variation parameter database 150 could hold functions that simulate global and local process variation scenarios, and/or could hold raw input data of parameters that typically vary during production of a microprocessor. Such global process variation parameters and local process variation parameters could be derived from one or more models, such as SPICE simulated transistor models.

Figure 2:
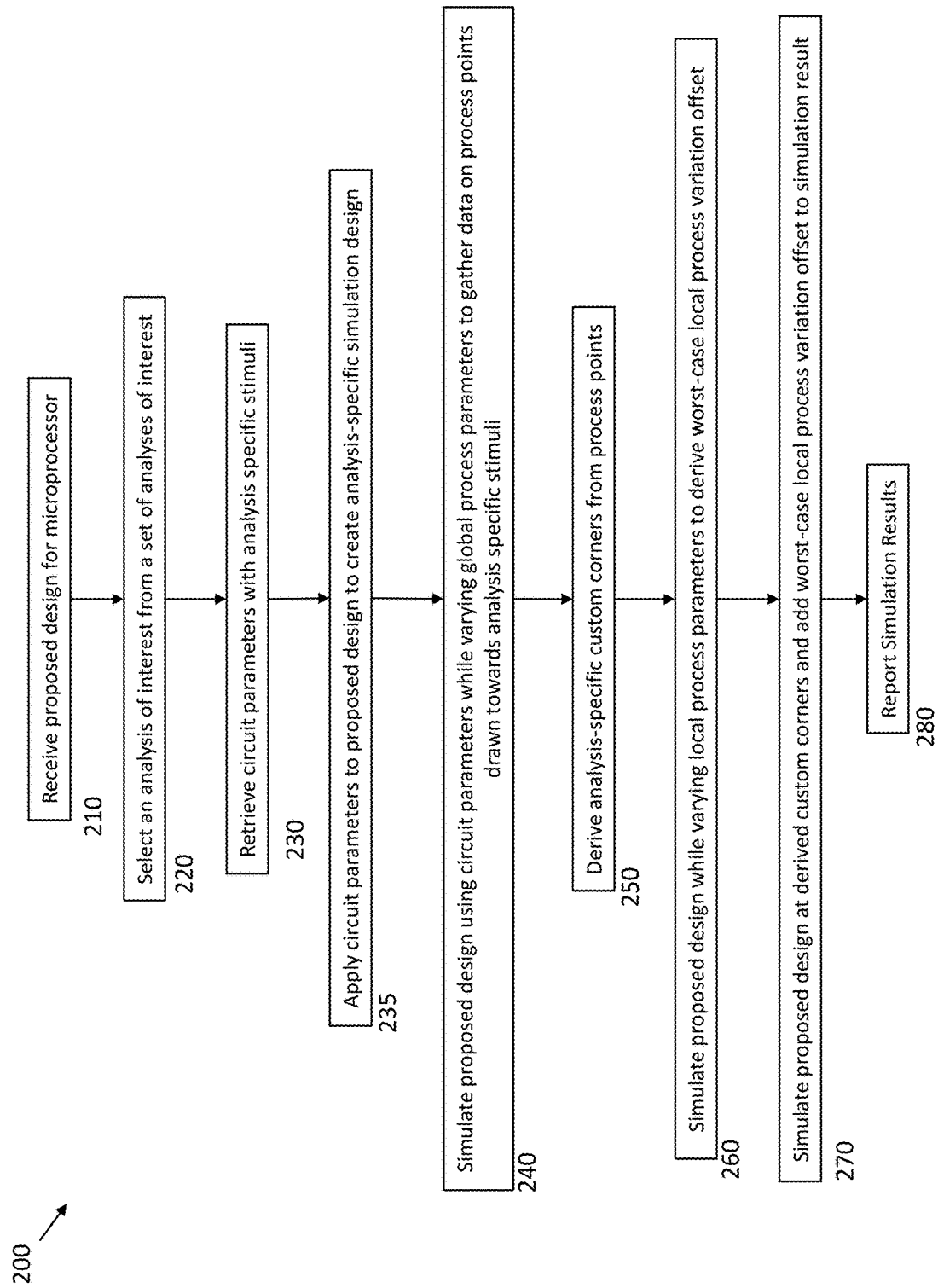
FIG. 2 shows a flowchart to derive analysis-specific custom corners.

In FIG. 2, a flowchart 200 shows an embodiment of a method to derive analysis-specific custom corners for use in an analysis-specific simulation. The steps illustrated in flowchart 200 are typically performed by computer system 120. In step 210, the system receives a proposed design for a microprocessor circuit from a user, such as from user interface 110 or a network-accessible storage device that transmits a proposed design to the computer system. Proposed designs could be submitted in any format that transmits a schematic or a layout for a microprocessor circuit, for example a SPICE model, a CAD drawing, a netlist, or a schematic.

In step 220, the system selects at least one analysis of interest from a set of analyses of interest. In some embodiments, the system presents a set of analyses of interest to the user via a user interface, and the user selects one or more analyses of interest to be run on the submitted proposed design. In other embodiments, the system automatically selects one or more analyses of interest using a predefined template, for example a system template that automatically selects a leakage analysis and a writability analysis. An exemplary set of analyses of interest includes, for example, an analysis of one or more set up time values for the circuit, an analysis of one or more hold time values for the circuit, an analysis of one or more voltage leakage values for the circuit, an analysis of one or more writability values for the circuit, an analysis of one or more charge-sharing values for the circuit, an analysis of one or more leakage power values for the circuit, an analysis of one or more dynamic power values for the circuit, and/or an analysis of one or more noise margin values for the circuit.

After the analysis (or analyses) of interest is/are selected, computer system 120 retrieves circuit parameters having analysis-specific stimuli in step 230. Such circuit parameters could be stored in any suitable manner, for example in a database structure, an XML file, and/or as an encrypted file, but is preferably saved as one or more SPICE decks having netlists and analysis-specific stimuli that are designed to test the upper and lower limits of a microprocessor measurement, such as the amount of voltage leakage at a portion of the microprocessor circuit. Preferably, the circuit parameters contain different design topologies, such as latches, flops, and memory designs, and some topologies could be interchangeable, such as two flops having the same functionality but different topographies. Preferably, the circuit parameters contain different test scenarios for each analysis of interest. For example, the circuit parameters could contain multiple tests for set up time of various portions of the microchip, and multiple tests for voltage leakage. A database having circuit parameters for a particular analysis of interest could have several sets of netlists corresponding to different tests and/or topologies. While the system could allow a user to select the retrieved circuit parameters corresponding to an analysis of interest or could select only the highest-rated circuit parameters, the system preferably retrieves all circuit parameters associated with the selected analysis of interest.

In step 235, the system applies the selected circuit parameters to the proposed design to create an analysis-specific simulation model complete with analysis-specific input stimuli. For example, where the circuit parameters are defined using netlists in a SPICE deck, measurements and/or topologies of circuit components specific to an analysis of interest are applied to components of a microprocessor schematic, analysis-specific input stimuli are applied to global inputs that feed into the microprocessor circuit, and/or analysis-specific output measurement nodes are defined for measuring microprocessor measurements being tested by the analysis.

The system then generally simulates the analysis-specific simulation model using the retrieved circuit parameters in step 240, for example using a SPICE simulator. The simulation varies global process parameters to obtain process points that are drawn to one or more selected analyses of interest. For global variation, the system could simulate hundreds or even thousands of simulations using the retrieved netlists as applied to the analysis-specific simulation model. Results from the simulations could then be analyzed by the system to produce process points which are representative of resulting global variation that could occur during fabrication of the analysis-specific simulation model.

In step 250, the system derives analysis-specific custom corners from the process points that were simulated. Preferably, the system fits a Weibull distribution to the simulated measurement data to obtain one or more distribution probability curves at various process points. In some embodiments, the system then transforms the distribution of the data from a Weibull distribution to a Gaussian distribution to determine binomial distributions of process points, and then adjusts the corner criteria in accordance with the correlation of simulated measurements. For example, a matrix having correlation values for each varied global parameter of the Gaussian distribution could be used to back-calculate a 3-σ corner for each global parameter as a function of the correlation matrix. Preferably, the system performs a 3-σ corner adjustment per analysis of interest, although 1-σ, 2-σ, and other standard deviation values could be used without departing from the scope of the invention. Other custom-corner derivation systems and methods could be used without departing from the scope of the invention. Exemplary systems that derive custom corners from such representative distributions include co-owned U.S. Pat. No. 8,819,605, filed Mar. 6, 2013, and U.S. Pat. No. 8,271,256, filed Aug. 13, 2009, which are both incorporated herein by reference.

In some embodiments, the system simulates the analysis-specific simulation model at the derived analysis-specific process corners in step 280 to produce a set of outputs that could be compared against the allowed limits and/or violation thresholds to determine whether the simulation triggers any violations. In other embodiments, the system takes into consideration worst-case local process variation parameters in steps 260 and 270, as explained below.

In step 260, the system simulates the analysis-specific simulation model at the derived analysis-specific custom corners while varying local process parameters. This produces new data, which could then be analyzed by the system to derive worst-case local process variation from the calculated mean; preferably at 3-σ, although other standard deviation values could be used without departing from the scope of the invention. The difference between the worst-case local process variation and the calculated mean could be used as a worst-case local process variation offset value.

In step 270, the system simulates the analysis-specific simulation model at the derived analysis-specific custom corners and adds the derived worst-case local process variation to the simulation results (or subtracts depending upon the analysis). Adding the worst-case local process offsets inherently produces more pessimistic results, but ensures that there is a higher likelihood of accurately detecting violations. In some embodiments, the system saves the simulation results to a non-transient computer-readable medium for data retrieval and analysis.

In step 290, the system reports the simulation results via any suitable means, for example to a user interface for review by a microchip designer, or by triggering a design interface or an alert to be sent (e.g. via email or text).

Figure 3:
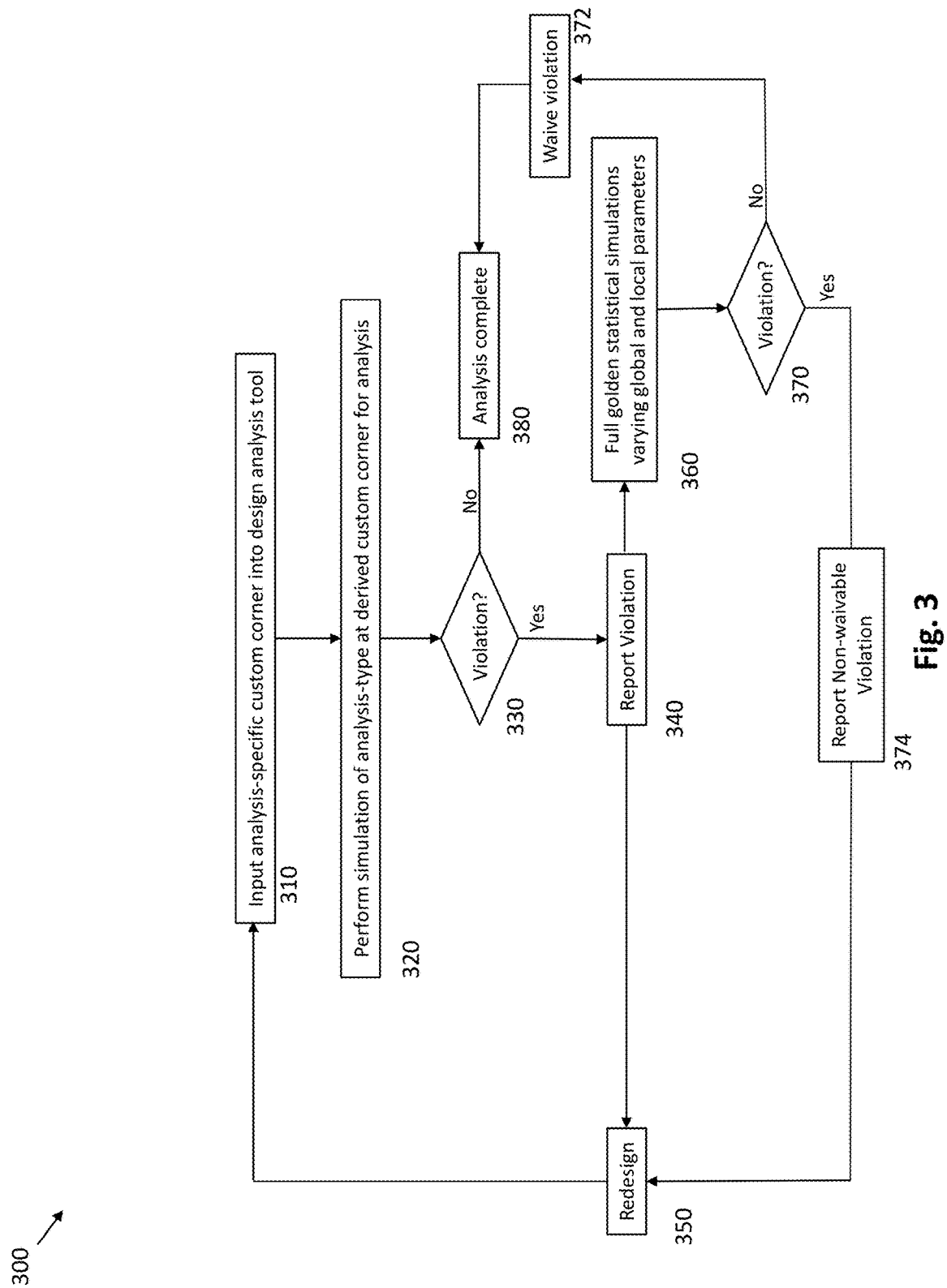
FIG. 3 shows a flowchart to test designs using analysis-specific custom corners.

In FIG. 3, a flowchart 300 shows an embodiment of a method to utilize the analysis-specific custom corners in design analysis. Once analysis-specific custom corners have been derived, simulations of the analysis-specific simulation model can be performed with a high level of accuracy, particularly when derived worst-case local variation offsets are added to the simulation result (or alternatively to the analysis limits). In step 310, the analysis-specific custom corners are input into the design analysis tool to evaluate the proposed design. Exemplary design analysis tools include Electronic Rule Checking (ERC), which could be used to perform analyses of interest, such as tests for voltage leakage and writability based upon pass/fail criteria and/or limits. (e.g. a circuit passes where voltage at a given junction of the circuit is at least 93% of the supply voltage, and fails where the voltage falls below 93% of the supply voltage)

In step 320, a design analysis can be performed with respect to the analysis of interest. The proposed design is preferably input into the design analysis tool in the form of SPICE netlists using the analysis-specific custom corners. Preferably, only one simulation is performed per analysis-type on the target circuits of interest at the derived custom corner.

In step 330, the simulation results are compared against the pass/fail criteria to determine whether the proposed design triggers a violation of the criteria. As stated above, preferably the derived worst-case simulation offset is added to the simulation result in order to capture more possible violations or is added to the allowed limits themselves. If no violation is detected, the proposed design passes the analysis test, and the analysis is complete at step 370. A notification is typically transmitted to a user of the system indicating that the proposed design failed to trigger any violations. A criteria could be, for example, the measurement of a voltage at a circuit node as compared to the supply voltage. When the voltage at that circuit node falls below 93% of the supply voltage, for example, a violation could trigger a notification to be sent, for example to a user interface or a redesign system.

If the simulation result triggers a violation, the system could report the violation to an appropriate entity in step 340, as previously described. In step 350, the microprocessor circuit is redesigned. In some embodiments, a user who receives a notice that the violation has been triggered could analyze the simulated results of the analysis of interest and redesign the microprocessor circuit in an effort to prevent the violation from triggering in a future simulation. In other embodiments, the system could utilize one or more automated systems that automatically redesign a microprocessor circuit as a function of the violation, such as U.S. Pat. Nos. 8,332,802, 8,875,082, or 9,043,741, which are each incorporated herein by reference. In such embodiments, the system could present a user with a list of systems to use that would automatically redesign elements of the microprocessor as a function of a violation, and the user could select automated redesign systems to be used for certain types of violations. For example, the user could select a first redesign system to be used for a voltage leakage violation over 10% of the violation threshold, a second redesign system to be used for a voltage leakage violation over 20% of the violation threshold, and a third redesign system to be used for a timing violation.

Once the system receives the revised proposed design, the system tests the revised proposed design in step 310 using the same analysis-specific custom corners. A user of the system could run through many iterations before the proposed design passes the analysis test at step 330. In embodiments using automated redesign systems, the user could set up the simulation process and walk away to work on other microprocessor circuits before returning to look at the results. In such embodiments, the system preferably stores the results of each proposed design and each triggered violation in a storage medium so that a user could analyze the simulation data. Using the same custom corners speeds up the process of the cycle of simulation-violation-redesign.

In step 360, the user may opt to perform a full-blown golden analysis of the proposed design varying all known global and local parameters instead of utilizing the custom corners (as custom corners are estimates of worse-case corners). The system could re-test the proposed design as a function of a full simulation of global and local parameter variations to determine whether use of the analysis-specific custom corners triggered a pessimistic violation. In step 370, the system determines whether the golden simulation triggered a worst-case violation. If no violation is triggered in the golden simulation, the system could waive the violation triggered using the custom corners in step 372 and complete the analysis at step 380. If a violation is still triggered, the system could report a non-waivable violation in step 374 to a user interface or to a redesign system, and redesign of the proposed design could then be received in response in step 350.

In FIG. 4, a bar graph 400 shows representative design measurements of voltage drops across a golden, full, spectrum varying both global and local process parameters. As shown, the voltage drop peaks at around 7% having a density of almost 0.20, and drops considerably, with a 3-σ golden value at golden point 440, which is the true 3-σ value of the worst-case voltage drop when varying all known global and local process parameters.

Traditional point 410 represents the tested worst-case voltage drop using traditional corner techniques that are non analysis-specific. Analysis-specific point 420 represents the tested voltage drop using the analysis-specific custom corners derived using analysis-specific netlist stimuli as applied to a proposed design. Analysis-specific variation offset point 430 represents the tested voltage drop after adding the worst-case calculated 3-σ local variation offset calculated.

As seen, traditional point 410, obtained using traditional methods, reports a voltage drop that is overly optimistic for a test designed to determine the maximum 3-σ voltage drop. As used herein, an "optimistic" test result is one which fails to trigger a violation, when a violation would be triggered using a full golden analysis. Analysis-specific point 420 is very close to the golden point 440, but is still slightly optimistic as compared to the golden point 440. Analysis-specific variation offset point 430 is about as close to the golden point 440 as analysis-specific point 420 is, but is slightly pessimistic as compared to golden point 440. As used herein, an "pessimistic" test result is one which falsely triggers, when a violation would not be triggered using a full golden analysis. Depending upon the error tolerances of the user, a user might prefer to use the analysis-specific custom corner without taking into consideration local variation parameters, as that custom corner lies very close to golden point 440, or may wish a slightly pessimistic result by taking into consideration worst-case local variation parameters to ensure that a majority of violations are captured.

Figure 5A:
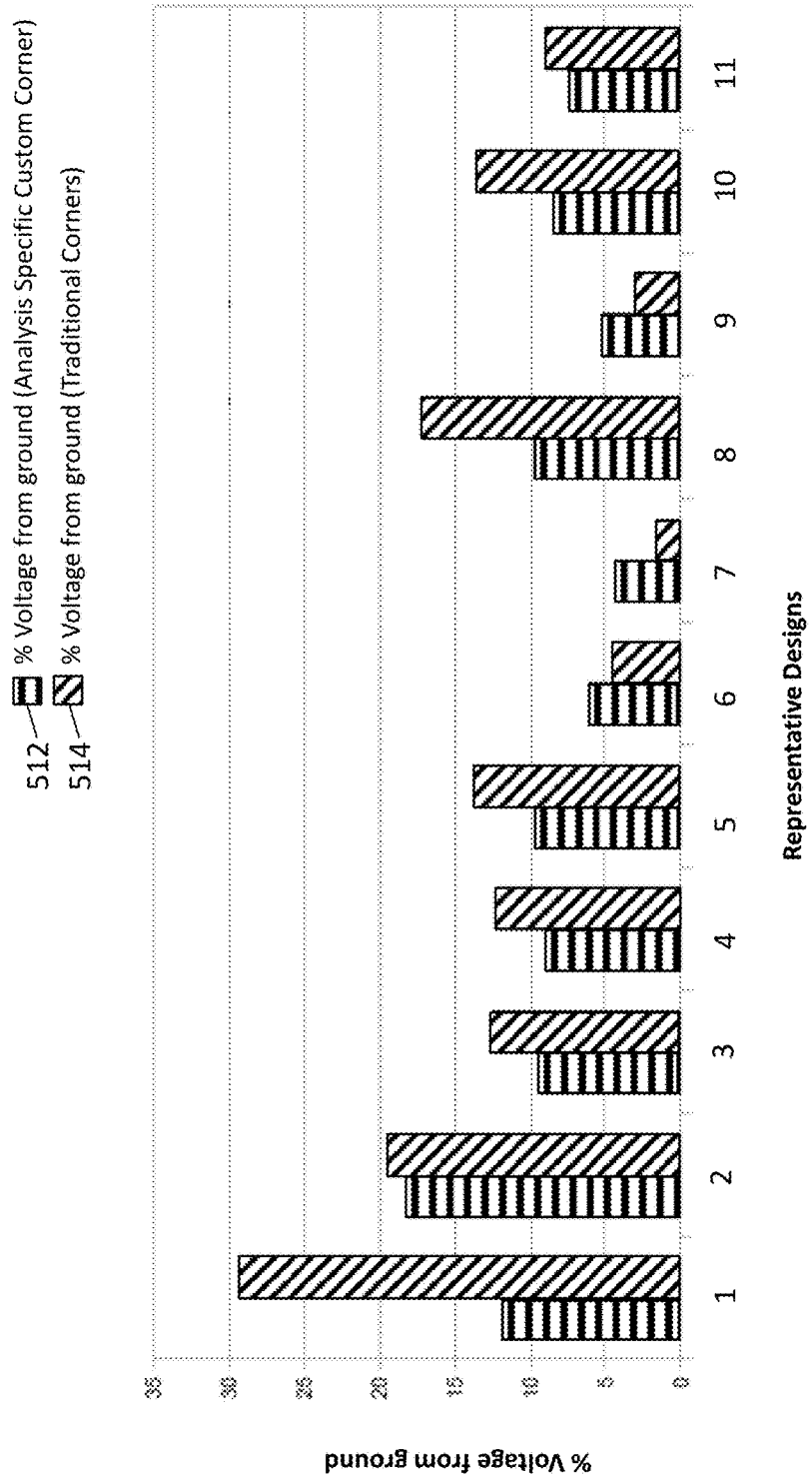
FIG. 5a-5b shows bar graphs illustrating measurement results of different types of designs using analysis-specific custom corners vs. traditional corners for writability and leakage analysis types, respectively.

In FIG. 5a, a bar graph 510 shows representative voltage measurements as compared to ground for a writability analysis for various representative designs designated design a through n. Bars 512 represent measurements of the voltage percentage using analysis specific custom corners while bars 514 represent measurements of the voltage percentage using traditional custom corners. As shown, most of the prior art traditional custom corner measurements are overly pessimistic, which could produce false violations.

Figure 5B:
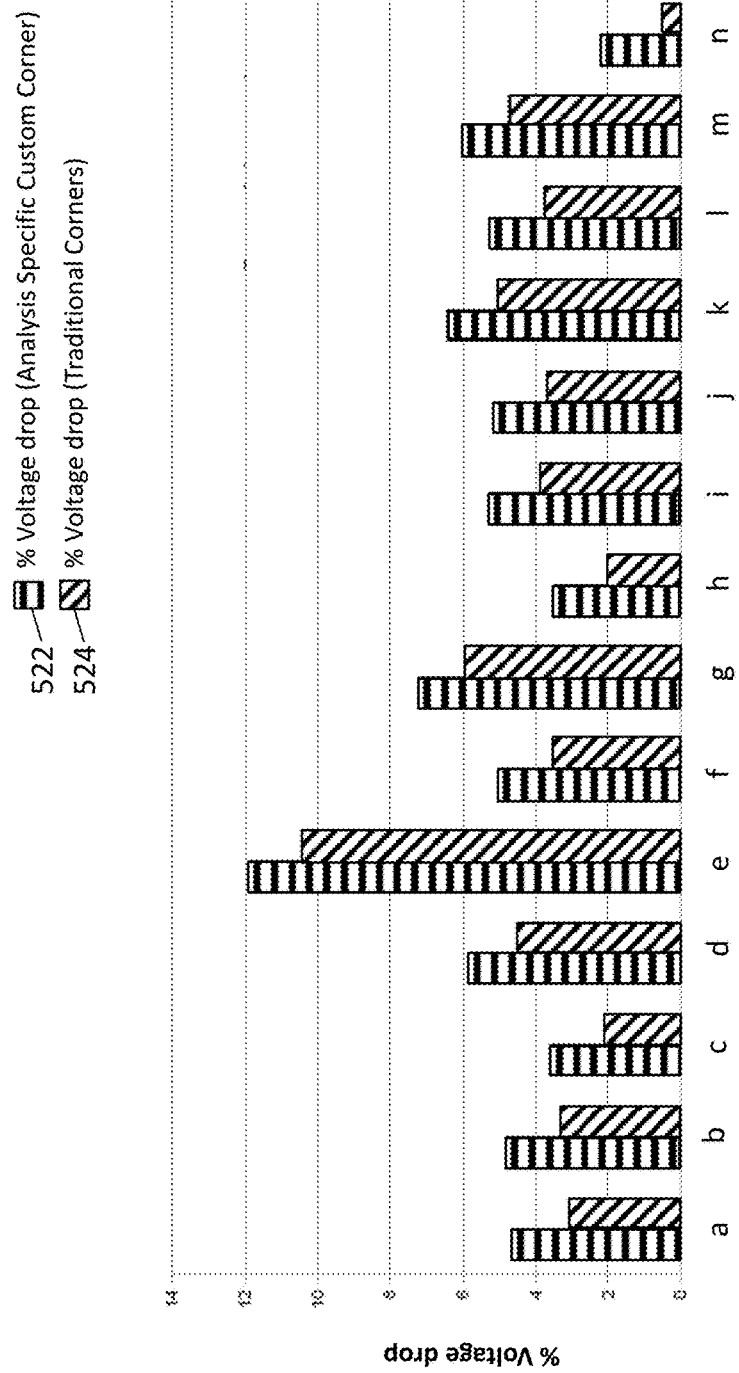

In FIG. 5b, a bar graph 520 shows representative voltage drop measurements for a voltage leakage for various representative designs designated design 1 through 11. Bars 522 represent measurements of the voltage drop using analysis specific custom corners while bars 524 represent measurements of the voltage drop using traditional custom corners. As shown, most of the prior art traditional custom corner measurements are overly optimistic, which could fail triggering violations or which could miss detecting violations.

Figure 6:
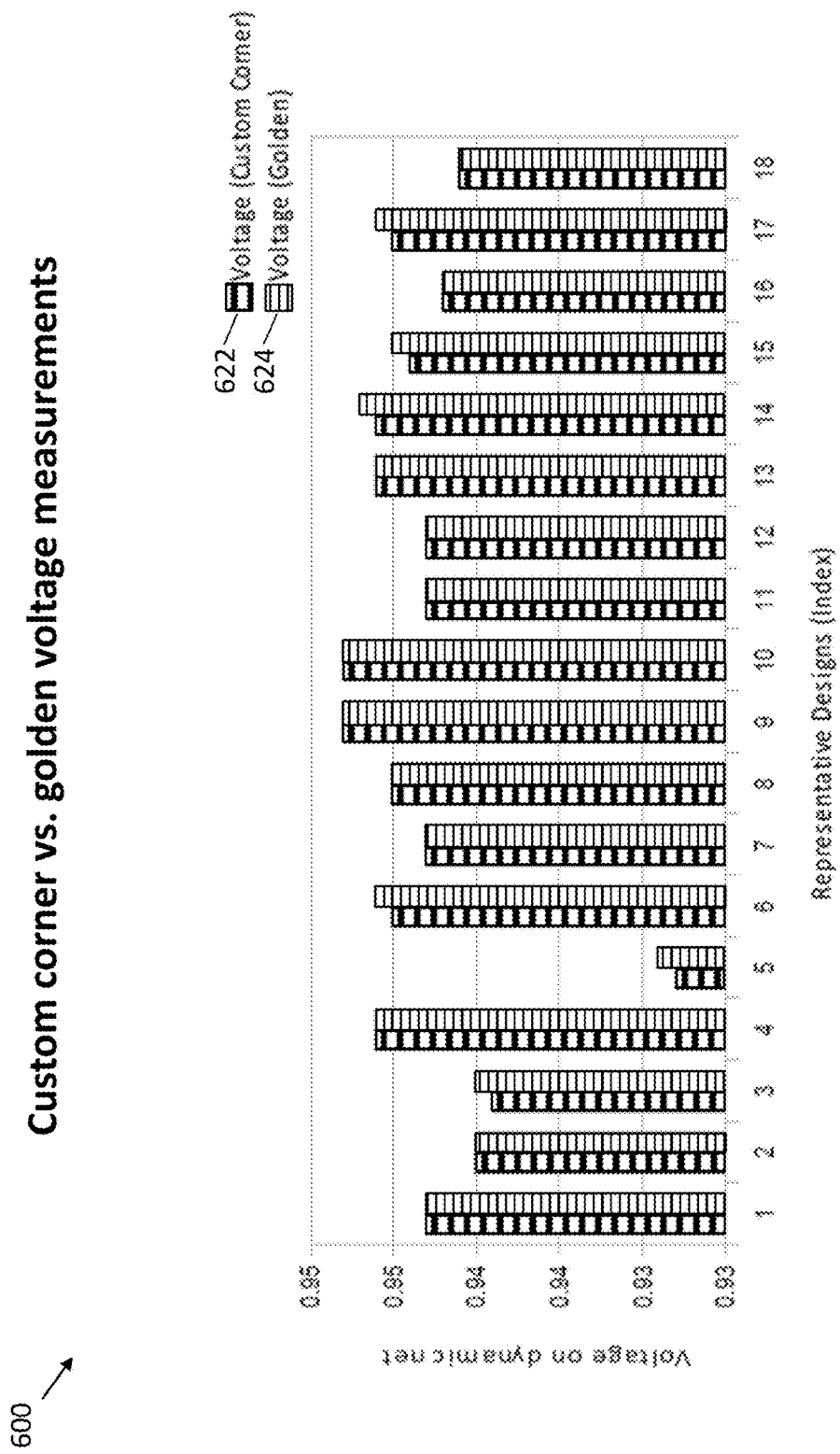
FIG. 6 shows a bar graph illustrating different measurement results using analysis-specific custom corners and golden full statistical analyses of representative designs by varying global and local process parameters.

In FIG. 6, a bar graph 600 shows representative voltage measurements comparing the measurements taken using analysis-specific custom corners against using a full-blown golden statistical analysis varying both global and local process parameters as representative designs designated 1 through 18. As shown, the measurements for the analysis-specific custom corners are close or are in good agreement with the full-blown golden statistical analysis, varying by at most 0.002 volts.

Figure 7:
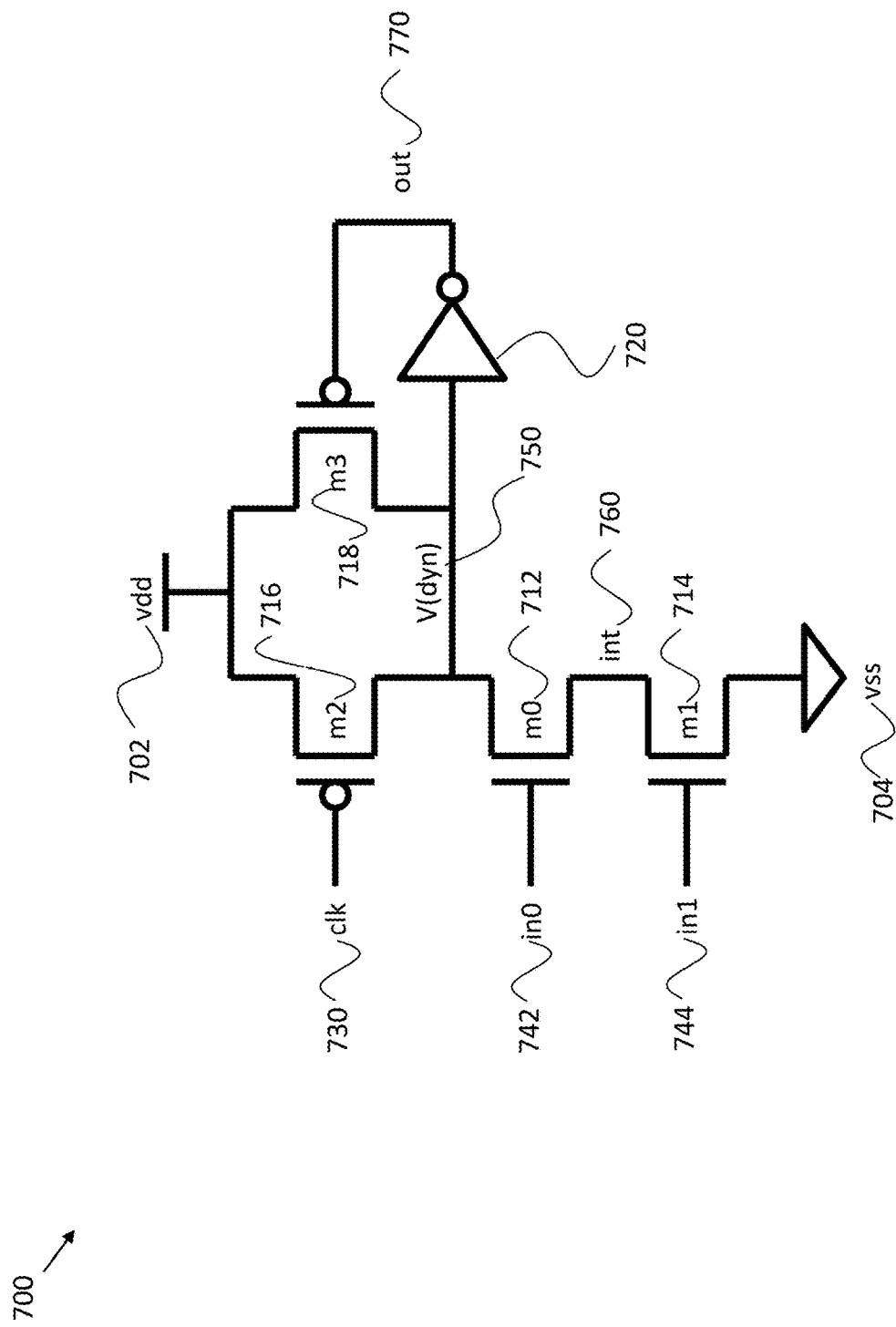
FIG. 7 shows an exemplary portion of a microprocessor design.

In FIG. 7, a proposed design 700 of a basic dynamic circuit has positive voltage source 702, negative voltage source 704, P-channel MOSFETS 716 and 718, N-channel MOSFETS 712 and 714, NOT gate 720, input clock signal 730, input signals 742 and 744, dynamic voltage node 750, intermediate node 760, and output node 770. The SPICE netlist that defines such a schematic is as follows:

```
.global vss vdd vnw vsb
.subckt dynckt clk in0 in1 out
* port IN clk
* port IN in0
* port IN in1
* port OUT out
m0 dyn in0 int vsb nmos_svt l=20n w=600n nf=1 m=1
m1 int in1 vss vsb nmos_svt l=20n w=600n nf=1 m=1
m2 dyn clk vdd vnw pmos_svt l=20n w=300n nf=1 m=1
m3 dyn out vdd vnw pmos_svt l=20n w=300n nf=1 m=1
xinv dyn out inv_2x pw=600n pl=20n pfingers=1 nw=300n nl=20n nfingers=1 m=1
.ends dynckt
.subckt inv_2x a b nl=20n nw=300n nfingers=1 pl=20n pw=600n pfingers=1 m=1
* port IN a
* port OUT b
mninv b a vss vsb nmos_svt l='nl' w='nw' nf='nfingers' m='m'
mpinv b a vdd vnw pmos_svt l='pl' w='pw' nf='pfingers' m='m'
.ends inv_2x
```

Such a schematic could be provided to a simulation system (such as computer system 120) to be tested using various analysis of interest. For example, a user could select this schematic and determine whether the circuit design meets the specifications of leakage and writability requirements at dynamic voltage node 750. The system could determine that one set of analysis-specific stimuli would be appropriate for analyzing leakage, while another set of analysis-specific stimuli would be appropriate for analyzing voltage.

Below is an example of a SPICE deck that defines analysis-specific stimuli for a writability analysis:
    v1ck clk 0 'vsupply'
    vin0 in0 0 PWL '0' '0' '10e-12' 'vsupply' '400e-12' 'vsupply' '410e-12' '0'
    vin1 in1 0 PWL '0' '0' '10e-12' 'vsupply' '400e-12' 'vsupply' '410e-12' '0'
    .IC V(dyn)='vsupply'

Below is an example of a SPICE deck that defines analysis-specific stimuli for a leakage analysis:
    v1ck clk 0 'vsupply'
    vin0 in0 0 '0.1*vsupply'
    vin1 in1 0 'vsupply'
    .IC V(dyn ='vsupply'

The system would apply the above leakage analysis stimuli to create an analysis-specific simulation model drawn towards a leakage analysis, and apply the above writability analysis stimuli to create an analysis-specific simulation model drawn towards a writability analysis. Each of the analysis-specific simulation models could be simulated and analyzed to derive analysis-specific custom corners for the simulation design by varying global process variation parameters and feeding the results through a custom corner derivation function. The system could then simulate the simulation design at the custom corners while varying local process variation parameters to derive 3-σ worst-case local process variation offsets, and could then simulate the simulation design at the custom corner while taking into account the local process variation offsets. If a violation is detected, the user could redesign the circuit and re-simulate at the same custom corners (without having to re-derive new custom conrers) until the system circuit design satisfies the conditions of the analysis of interest.

It should be apparent to those skilled in the art that many more modifications besides those already described are possible without departing from the inventive concepts herein. The inventive subject matter, therefore, is not to be restricted except in the scope of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification refers to at least one of something selected from the group consisting of A, B, C . . . and N, the text should be interpreted as requiring only one element from the group, not A plus N, or B plus N, etc.

What is claimed is:

1. A system that evaluates designs for a microprocessor circuit, comprising a non-transitory computer-readable medium storing instructions that, when executed by a computer processor, cause the computer processor to perform the steps of:
    receiving a proposed design for the microprocessor circuit;
    selecting a first analysis of interest from a set of analyses of interest that evaluates values of a first microprocessor measurement of interest;
    selecting a first set of circuit parameters from a set of representative circuit parameters having analysis-specific stimuli as a function of the first analysis of interest and the proposed design;
    applying the first set of circuit parameters to the proposed design to construct a first analysis-specific simulation model;
    deriving a first set of analysis-specific custom corners for the proposed design as a function of the first analysis-specific simulation model;
    simulating the first analysis-specific simulation model as a function of the first set of analysis-specific custom corners to derive a first set of worst-case values for the first microprocessor measurement of interest;
    evaluating the first set of worst-case values against a set of allowed limits for the first microprocessor measurement of interest;
    transmitting a notification of a violation when at least one of the first set of worst-case values violates at least one of the set of allowed limits;
    simulating the first analysis-specific simulation model while varying global process parameters and local process parameters to produce a golden set of empirical models;
    evaluating the golden set of empirical models against the set of allowed limits for the first microprocessor measurement of interest;
    transmitting a notification to waive the violation when none of the golden set of empirical models violates any of the set of allowed limits for the first microprocessor measurement of interest,
    modifying the proposed design using the first analysis-specific simulation model and the derived first set of worst-case values for the first microprocessor measurement of interest; and
    fabricating the modified proposed design.

2. The system of claim 1, wherein the non-transitory computer-readable medium further stores instructions that, when executed by the computer processor, cause the computer processor to perform the steps of:
    selecting a second analysis of interest from the set of analyses of interest that evaluates values of a second microprocessor measurement of interest, wherein the second microprocessor measurement of interest is different from the first microprocessor measurement of interest;
    selecting a second set of circuit parameters from the set of representative circuit parameters as a function of the second analysis of interest and the proposed design, wherein the second set of circuit parameters are different from the first set of circuit parameters;
    applying the second set of circuit parameters to the proposed design to construct a second analysis-specific simulation model;
    deriving a second set of analysis-specific custom corners for the proposed design as a function of the second analysis of interest; and
    simulating the second analysis-specific simulation model as a function of the second set of analysis-specific custom corners to derive a second set of worst-case values for the second microprocessor measurement of interest.

3. The system of claim 1, wherein the first analysis of interest is selected from the group consisting of:
    an analysis of set up time values;
    an analysis of hold time values;
    an analysis of voltage leakage values;
    an analysis of writability values;
    an analysis of charge-sharing values;
    an analysis of leakage power values;
    an analysis of dynamic power values; and an analysis of noise margin values, wherein at least two of the analyses of interest have different corresponding input stimuli.

4. The system of claim 1, wherein the first set of circuit parameters comprises a first design topology for the proposed design and a second design topology for the proposed design.

5. The system of claim 1, wherein the non-transitory computer-readable medium further stores instructions that, when executed by the computer processor, cause the computer processor to perform the steps of:
simulating the first analysis-specific simulation model as a function of the first set of analysis-specific custom corners while varying local process variation parameters to produce a set of local process variation results;
deriving worst-case local process variation offsets as a function of the set of local process variation results.

6. The system of claim 5, wherein the non-transitory computer-readable medium further stores instructions that, when executed by the computer processor, cause the computer processor to add at least one of the worst-case local process variation offsets to a violation threshold for the first microprocessor measurement of interest.

7. The system of claim 5, wherein the non-transitory computer-readable medium further stores instructions that, when executed by the computer processor, cause the computer processor to add at least one of the worst-case local process variation offsets to the first set of worst-case values for the first microprocessor measurement of interest.

8. A computer-implemented method of evaluating designs for a microprocessor circuit, the method comprising:
receiving, by a computer processor, a proposed design for the microprocessor circuit;
receiving, by a computer processor, a first analysis of interest that evaluates values of a first microprocessor measurement of interest;
identifying, by a computer processor, a first set of circuit parameters having analysis-specific stimuli as a function of the first analysis of interest and the proposed design;
producing, by a computer processor, first analysis-specific simulation model as a function of the first set of circuit parameters;
deriving, by a computer processor, a first set of analysis-specific custom corners for the proposed design as a function of the first analysis-specific simulation model;
simulating, by a computer processor, the first analysis-specific simulation model as a function of the first set of analysis-specific custom corners to derive a first set of worst-case values for the first microprocessor measurement of interest
evaluating, by a computer processor, the first set of worst-case values against a set of allowed limits for the first microprocessor measurement of interest;
transmitting, by a computer processor, a notification of a violation when at least one of the first set of worst-case values violates at least one of the set of allowed limits;
simulating, by a computer processor, the first analysis-specific simulation model while varying global process parameters and local process parameters to produce a golden set of empirical models;
evaluating, by a computer processor, the golden set of empirical models against the set of allowed limits for the first microprocessor measurement of interest;
transmitting, by a computer processor, a notification to waive the violation when none of the golden set of empirical models violates any of the set of allowed limits for the first microprocessor measurement of interest;
modifying the proposed design using the first analysis-specific simulation model and the derived first set of worst-case values for the first microprocessor measurement of interest; and
fabricating the modified proposed design.

9. The method of claim 8, wherein the step of deriving the first set of analysis-specific custom corners comprises performing statistical circuit simulations of the first analysis-specific simulation model to obtain analysis-specific simulated measurement data.

10. The method of claim 9, wherein the step of deriving the first set of analysis-specific custom corners comprises fitting a Weibull distribution to the analysis-specific simulated measurement data.

11. The method of claim 10, wherein the step of deriving the first set of analysis-specific custom corners further comprises transforming the Weibull distribution to a transformed Gaussian distribution.

12. The method of claim 11, wherein the step of deriving the first set of analysis-specific custom corners further comprises inputting the transformed Gaussian distribution to a joint probability distribution set to achieve a target joint sigma level.

13. The method of claim 9, wherein the statistical circuit simulations vary a first set of global process parameters between each statistical circuit simulation.

14. The method of claim 13, further comprising:
simulating the first analysis-specific simulation model as a function of the first set of analysis-specific custom corners while varying local process variation parameters to produce a set of local process variation results; and
deriving worst-case local process variation offsets as a function of the set of local process variation results.

15. The method of claim 14, further comprising adding at least one of the worst-case local process variation offsets to a violation threshold for the first microprocessor measurement of interest.

16. A computer system that evaluates designs for a microprocessor circuit, the computer system comprising:
a user interface programmed to:
receive a proposed design for the microprocessor circuit; and
receive a selection of a first analysis of interest from a set of analyses of interest that evaluates values of a first microprocessor measurement of interest; and
a computer processor programmed to:
select a first set of circuit parameters from a set of representative circuit parameters having analysis-specific stimuli as a function of the first analysis of interest and the proposed design;
apply the first set of circuit parameters to the proposed design to construct a first analysis-specific simulation model;
derive a first set of analysis-specific custom corners for the proposed design as a function of the first analysis-specific simulation model;
simulate the first analysis-specific simulation model as a function of the first set of analysis-specific custom corners to derive a first set of worst-case values for the first microprocessor measurement of interest;
evaluate the first set of worst-case values against a set of allowed limits for the first microprocessor measurement of interest;

transmit a notification of a violation when at least one of the first set of worst-case values violates at least one of the set of allowed limits;

simulate the first analysis-specific simulation model while varying global process parameters and local process parameters to produce a golden set of empirical models;

evaluate the golden set of empirical models against the set of allowed limits for the first microprocessor measurement of interest;

transmit a notification to waive the violation when none of the golden set of empirical models violates any of the set of allowed limits for the first microprocessor measurement of interest; and enable modification of the proposed design using the first analysis-specific simulation model and the derived first set of worst-case values for the first microprocessor measurement of interest; and fabricate the modified proposed design.

17. The computer system of claim 16, wherein the computer processor is further programmed to transmit an instruction to redesign the proposed design to overcome the violation.

18. The computer system of claim 17, wherein the computer processor is further programmed to:

receive a redesign of the microprocessor circuit;

apply the first set of circuit parameters to the redesign to construct a second analysis-specific simulation model; and simulate a second set of worst-case empirical models of the microprocessor circuit as a function of the first set of analysis-specific custom corners and the second analysis-specific simulation model.

* * * * *

UNITED STATES PATENT AND TRADEMARK OFFICE
CERTIFICATE OF CORRECTION

PATENT NO. : 10,204,200 B2
APPLICATION NO. : 15/197366
DATED : February 12, 2019
INVENTOR(S) : Sattiraju Page 1 of 1

It is certified that error appears in the above-identified patent and that said Letters Patent is hereby corrected as shown below:

On the Title Page

Page 2, Column 2, item [56], under Other Publications, Line 21, delete "-AwareCustom" and insert
-- -Aware Custom --, therefor.

In the Specification

Column 5, Line 32, delete "FIG." and insert -- FIGS. --, therefor.

Column 10, Line 21, delete "voltage)" and insert -- voltage). --, therefor.

Column 13, Line 3, delete "v1ck" and insert -- vlck --, therefor.

Column 13, Line 11, delete "v1ck" and insert -- vlck --, therefor.

Column 13, Line 14, delete "V(dyn" and insert -- V(dyn) --, therefor.

Column 13, Line 32, delete "conrers)" and insert -- corners) --, therefor.

In the Claims

Column 15, Line 16, Claim 5, delete "results;" and insert -- results; and --, therefor.

Signed and Sealed this
Twenty-eighth Day of January, 2020

Andrei Iancu
*Director of the United States Patent and Trademark Office*